United States Patent [19]
Adachi et al.

[11] Patent Number: 5,709,959
[45] Date of Patent: Jan. 20, 1998

[54] ORGANIC THIN FILM ELECTROLUMINESCENCE DEVICE

[75] Inventors: Chihaya Adachi; Kazukiyo Nagai; Nozomu Tamoto, all of Tokyo, Japan

[73] Assignee: Ricoh Company, Ltd., Tokyo, Japan

[21] Appl. No.: 529,580

[22] Filed: Sep. 18, 1995

[30] Foreign Application Priority Data

Sep. 16, 1994 [JP] Japan ................................. 6-248421

[51] Int. Cl.$^6$ ............................................. H05B 33/00
[52] U.S. Cl. ............................. 428/690; 428/917; 313/504
[58] Field of Search ............................. 428/690, 691, 428/917; 313/504

[56] References Cited

U.S. PATENT DOCUMENTS 5,457,565  10/1995  Namiki et al. ............................ 359/273

*Primary Examiner*—Charles Nold
*Attorney, Agent, or Firm*—Oblon, Spivak, McClelland, Maier & Neustadt, P.C.

[57] ABSTRACT

An organic thin film electroluminescence (EL) device having an organic light emitting layer consisting of an organic substance placed between an anode and a cathode which face each other is provided, in which the ionization potential (Ip) of the anode satisfies the formula: Ip>5.0 eV.

11 Claims, 3 Drawing Sheets

ORGANIC THIN FILM ELECTROLUMINESCENCE DEVICE

BACKGROUND OF THE INVENTION

1. Field of the Invention

The present invention relates to an organic electroluminescent display device that contains an organic luminescent layer comprising a luminescent substance, is able to transform electric energy into light energy directly by application of voltage making a flat panel display possible unlike a conventional fluorescent lamp, fluorescent lamp, or light emitting diode. Particularly the display device of this invention is an organic electroluminescence device that is able to emit at high intensity for a long period (high durability).

2. Description of the Related Art

To meet the diversification and space-saving requirement of data processing equipment, the need for a flat display device that consumes less electric power and occupies smaller space than a CRT has increased. As such flat display devices, there are liquid crystal and plasma display. Recently, developments in organic electroluminescence display devices (hereinafter also referred to as organic EL device) of a self emitting type have been enhanced with clear displays able to be driven by a low voltage direct current.

As for the structure of organic EL devices, the structures of multilayered-type device have been reported including: two-layer structures such as a SH-A structure wherein a hole-injection layer and light emitting layer are formed between the anode and cathode (JP-A 59-194393, Appl. Phys. Lett. 51, 913 (1987)) and a SH-B structure wherein a light emitting layer and electron injection and transporting layer are formed between the anode and cathode (U.S. Pat. No. 5,085,947, JP-A 2-25092, Appl. Phys. Lett. 55, 1489 (1989)); and a three-layer structure (DH structure) wherein hole injection and transporting layer/light emitting layer/electron injection and transporting layer are formed (Appl. Phys. Lett. 57, 531 (1990). Quite recently, an EL device structure has been reported that is composed of two or more of layers of a hole injection and transporting layer or of an electron injection and transporting layer (JP-A 5-94880, U.S. Pat. No. 4,720,432).

As the cathode mentioned above, an electrode material of a large work function such as Au or ITO (indium-tin-oxide) is used; as the anode, an electrode material of a small work function such as Ca, Mg, Al, or their alloys is used.

Up to now, various organic compounds have been reported as usable materials for the hole injection and transporting layer, light emitting layer and electron injection and transporting layer mentioned above. Examples of these organic compounds include: aromatic tertiary amines and phthalocyanines for the hole injection and transporting layer; aluminum trisoxine (JP-A 59-194393, JP-A 63-295695), styrilamine derivatives, styrilbenzene derivatives (JP-A 2-209988) and aminopyrine derivatives for the light emitting layer; and oxadiazole derivatives (Nippon Kagaku Kaishi No. 11, 1540 (1991), JP-A 4-363894, JP-A 5-202011) for the electron injection and transporting layer.

Up to now, EL devices have been obtained that exhibit, at an initial stage, a high intensity emission of 1000 cd/m² or more and drive at a voltage of 10 V or less. However, during continuous drive, decrease of the light output and increase of the driving voltage are observed with time, and finally the EL devices themselves are destroyed in a short circuit mode.

Such degradation of the EL devices is understood to be due to change of electrical properties of the devices caused by (1) crystallization of the organic material with the elapse of time and accompanied accumulation of the space charge of the organic layer and caused by (2) polarization of the organic molecules induced by dielectric polarization with application of electric field in a certain direction, and (3) due to degradation of the electrodes caused by oxidation or other factors. Hence, trials to improve the durability have been made from the standpoint of materials and the driving methods of EL devices as a means to inhibit the degradation of the devices during continuous drive; however, a satisfactory solution has not been found yet.

SUMMARY OF THE INVENTION

An object of the present invention is to provide an EL device that is highly durable by controlling the ionization potential of the anode over a long period of continuous operation.

The present inventors have studied the deterioration mechanism of organic EL devices in detail and found that an energy barrier (injection barrier) associated with carrier injection of an organic layer interface contiguous to the anode and cathode is significantly involved in the durability of the devices. In particular, it has been found that the durability is substantially increased when the ionization potential of the anode used is not less than a certain value; these finding led to the completion of the present invention.

According to the present invention, an organic EL device having an organic light emitting layer consisting of an organic substance placed between an anode and a cathode which face each other characterized by the ionization potential (Ip) of the anode satisfies the following formula (1):

$$Ip > 5.0 \text{ eV} \tag{1}$$

In an organic EL device, there are: hole transportation from an anode to a hole injection and transporting layer and a hole injection process from the hole injection and transporting layer to a light emitting layer; and, electron injection from a cathode to an electron injection and transporting layer, electron transportation within the electron injection and transporting layer, and electron injection process from the electron injection and transporting layer to the light emitting layer for the electron injection. The electron injected into the light emitting layer and the hole are combined again; thereby, an excitor is formed and EL emission occurs. In these plural processes, one of the factors for deterioration of the device is generation of Joule's heat. Hence, reduction of the carrier injection barrier and improvement of carrier transportation capability are effective for inhibiting the generation of Joule's heat of the device and improve the durability. For example, Adachi et al. reports that making the ionization potential of the hole injection and transporting layer contiguous to the anode smaller can reduce the injection barrier and improve the durability (JP-A 5-239455). They report in particular that use of a material having an ionization potential of 5.08 eV in the interface with the anode improves the durability. This suggests that making the ionization potential smaller furthermore might improve the durability more; however, making the ionization potential of the organic material smaller, which is possible by enlargement of π conjugated systems or by introduction of donor groups, tends to make the material easily oxidized and make the band gap too small. Thus, excessively small ionization potential is not suitable for EL materials.

The present inventors therefore have studied the electrode not on the organic material and found that controlling the ionization potential Ip of the anode not less than 5.0 eV can improve the durability; this is the basis of the present invention.

DETAILED DESCRIPTION OF THE PREFERRED EMBODIMENTS

Figure 1A:
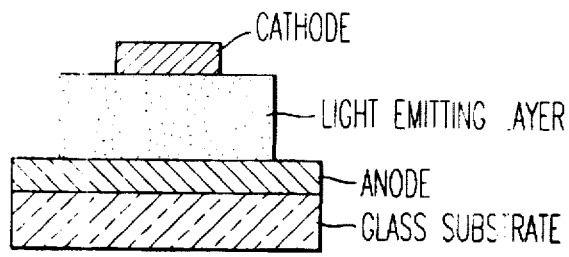
FIG. 1 is a cross-sectional view of an organic EL device according to the present invention, wherein (a) is a light emitting layer of one-layer type, (b) is a hole injection and transporting layer/light emitting layer type, (c) is a light emitting layer/electron injection and transporting layer type, and (d) is a hole injection and transporting layer/light emitting layer/electron injection and transporting layer type.
Figure 1B:
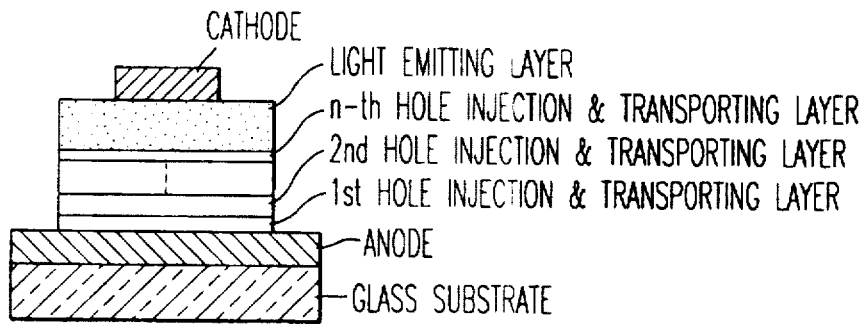
Figure 1C:
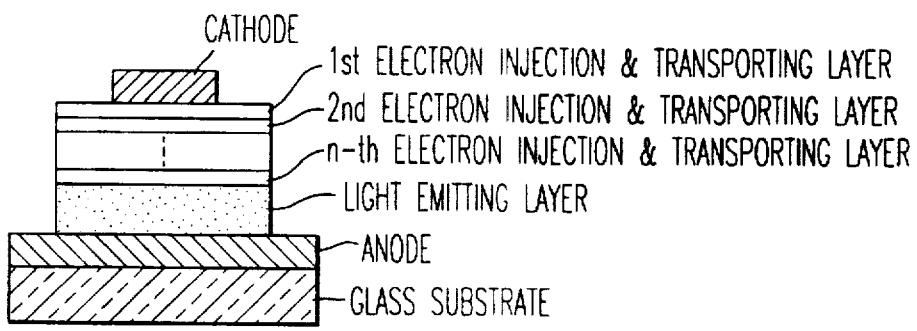
Figure 1D:
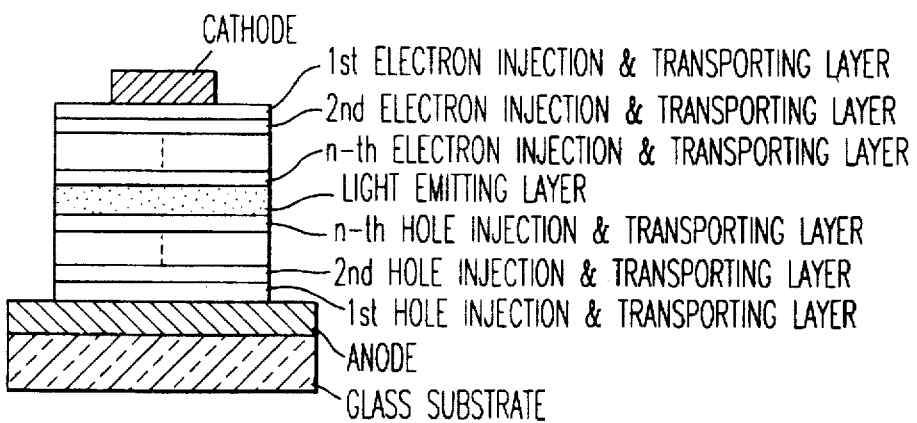

The anode used in the present invention should satisfy, as mentioned previously, the conditional formula:

$$Ip > 5.0 \text{ eV}$$

If the ionization potential Ip is less than 5.0 eV, the light output is decreased and the driving voltage is increased with the passage of time; the EL device itself is destroyed thereby and improved durability of the organic EL device cannot be realized.

Any materials that satisfy Ip>5.0 eV may be used as the anode. Examples of the material include: metals such as nickel, gold, platinum, palladium, and their alloys; metal compounds such as tin oxide, indium tin oxide, copper iodide and their mixtures; and conductive polymers such as polyaniline, polypyrrole, polyparaphenylenevinylene, polythienylenevinylene and polythiophene. From the standpoint of transparency, so-called transparent electrodes are preferable such as indium-tin-oxide (ITO) having about 60% or higher transmittance in the visible region of 400 nm to 800 nm, tin oxide and platinum, and semitransparent spatter films of nickel; in particular indium-tin-oxide (ITO) is most preferable.

When using the electrode materials, surface treatment such as plasma discharge may be preferably applied on the electrode surface as required for satisfying the condition Ip>5.0 eV.

Various gases may be used as the plasma gas; while oxygen is preferable in particular, inert gases such as nitrogen and argon and their mixture may be used as well.

In the present invention, solvent treatment may be applied on the electrode surface preliminarily using hydrochloric acid, sulfuric acid, acetic acid or their mixture or various alkaline solvents as required; thereafter the treatment for making the value of ionization potential not less than 5.0 eV may be applied.

The cathode material used in the organic EL device according to the present invention is a metal that has small work function. Examples of such metal include silver, tin, lead, magnesium, manganese, aluminum, potassium, lithium and their alloys.

Preferably, at least the materials of one of the anode and cathode is sufficiently transparent in the emitted light wavelength region of the device. More specifically, 80% or higher light transmittance is preferred.

The structure of the organic EL device according to the present invention is not limited in particular; for example, the structure may be, as shown in FIG. 1, (a) light emitting layer of one-layer type, (b) hole injection and transporting layer comprising at least one layer/light emitting layer type, (c) light emitting layer/electron injection and transporting layer comprising at least one layer type, or (d) hole injection and transporting layer comprising at least one layer/light emitting layer/electron injection and transporting layer comprising at least one layer type.

The organic layer of the organic EL device according to the present invention may be formed by evaporation, or formed by solvent coating using a polymer binder; for example, casting, spin coating, blade coating or dipping may be applied.

Now, specific examples of the organic compound used in the organic EL device according to the present invention are shown hereunder.

The electron injection and transporting layer material may be any one known conventional materials; for example, oxadiazole derivatives shown below may he used.

TABLE 1

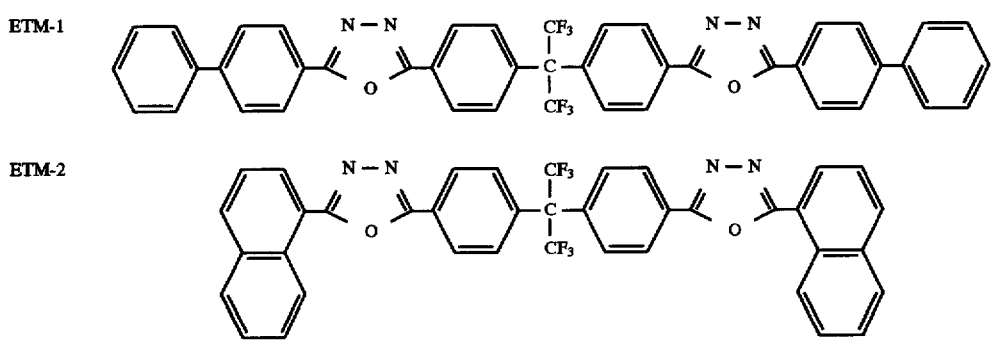

TABLE 1-continued
ETM-3
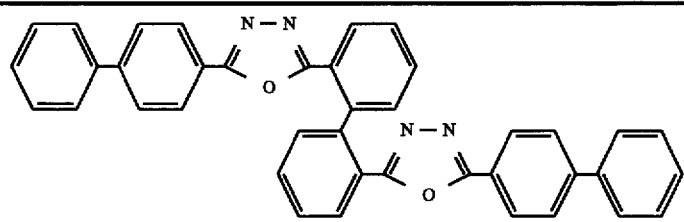
ETM-4
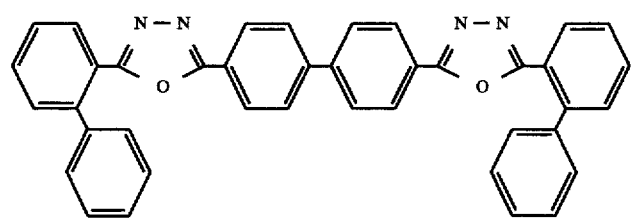
ETM-5
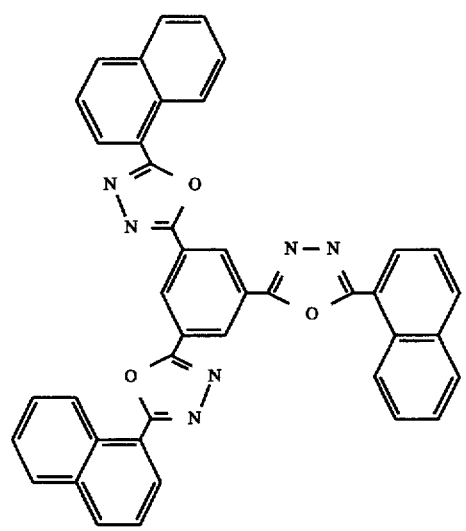
ETM-6
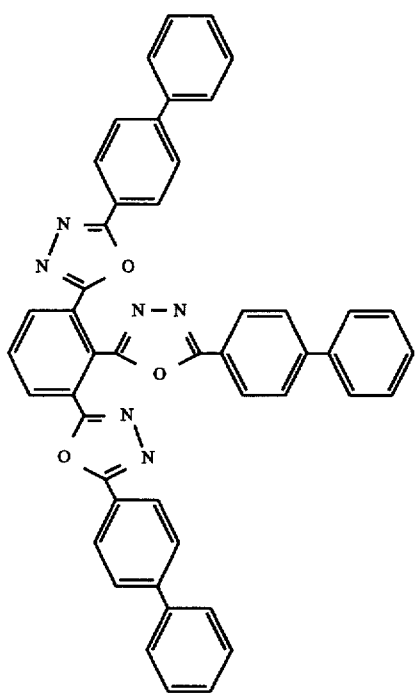

TABLE 1-continued
ETM-7
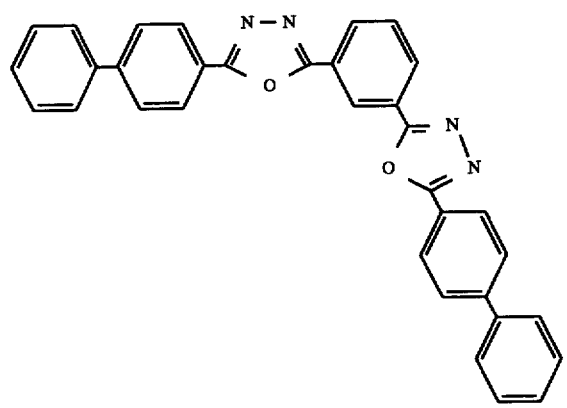
ETM-8
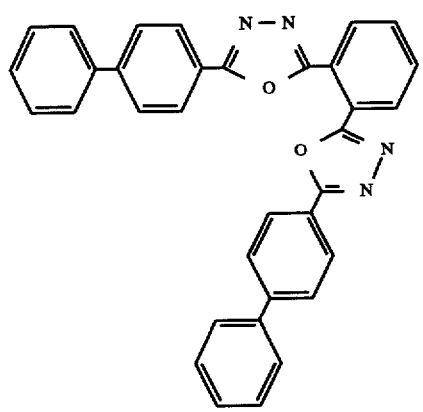
ETM-9
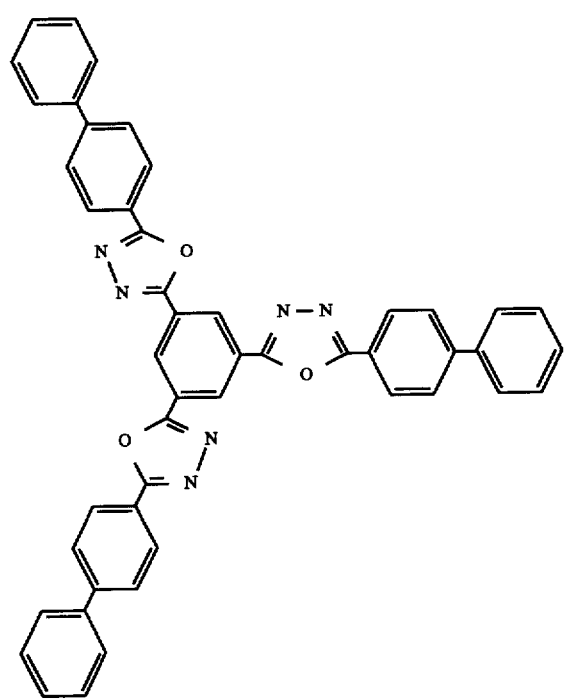

TABLE 1-continued
ETM-10
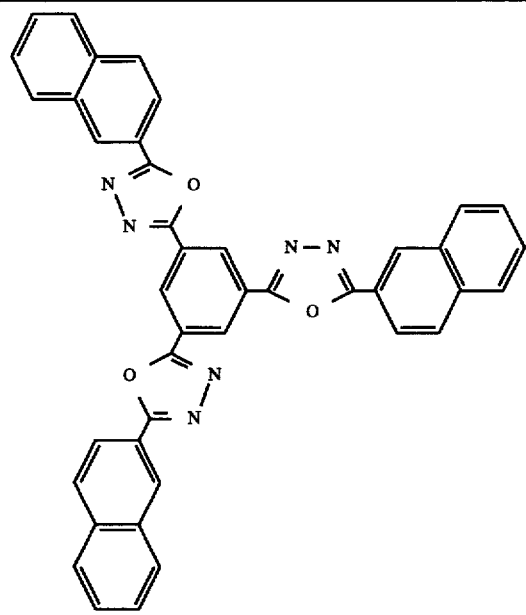
ETM-11
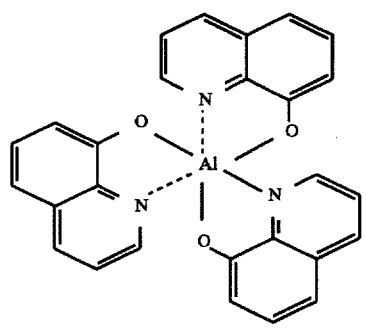
The hole injection and transporting layer material may be any one of known conventional materials; for example, triphenylamine derivatives shown below may be used.
TABLE 2
HTM-1
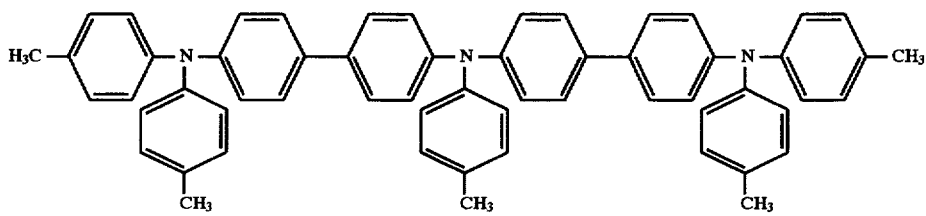
HTM-2
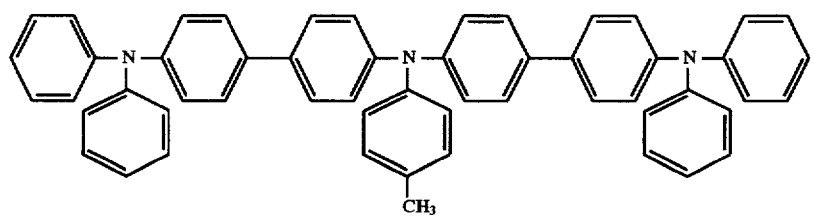

TABLE 2-continued
HTM-3 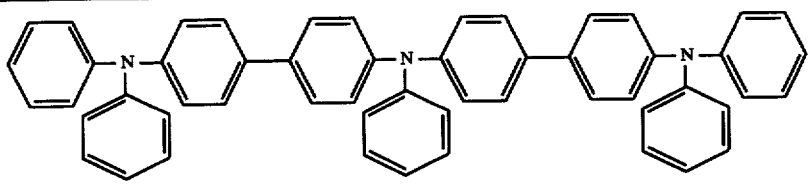
HTM-4 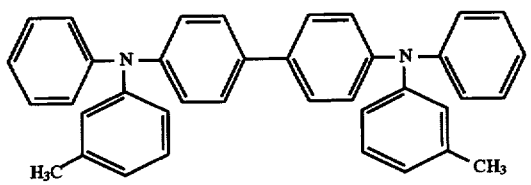
HTM-5 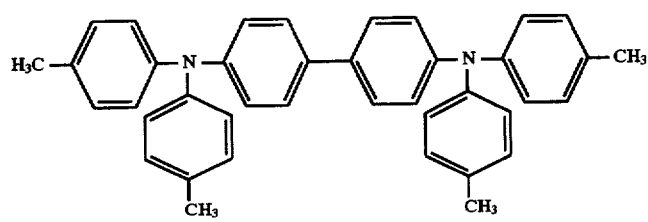
HTM-6 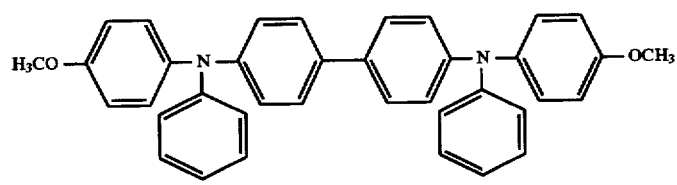
HTM-7 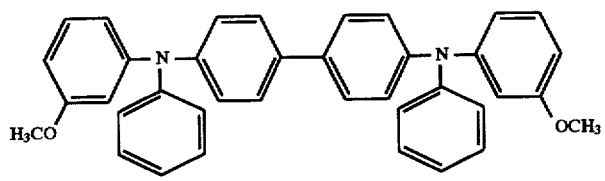
HTM-8 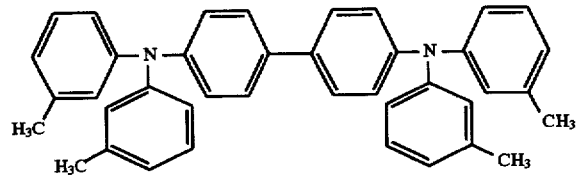
HTM-9 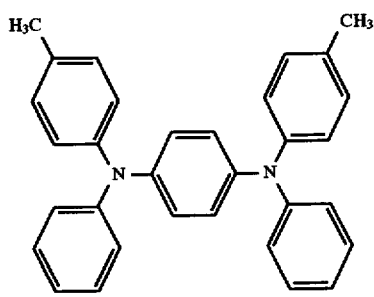

TABLE 2-continued

| | |
|---|---|
| HTM-10 | [structure: bis(4-methoxyphenyl)-N,N'-diphenyl-p-phenylenediamine] |
| HTM-11 | [structure: bis(3-methylphenyl)-N,N'-diphenyl-p-phenylenediamine] |
| HTM-12 | $H_2$-Phthalocyanine |
| HTM-13 | Cu-Phthalocyanine |

The light emitting layer material may be any one of known conventional materials; for example, amino-pyrene dimer derivatives shown below may be used.

TABLE 3

| | |
|---|---|
| EM-1 | [structure: bis(2-methylphenyl)-bis(1-pyrenyl)-m-phenylenediamine] |
| EM-2 | [structure: bis(2-methoxyphenyl)-bis(1-pyrenyl)-m-phenylenediamine] |

TABLE 3-continued

EM-3
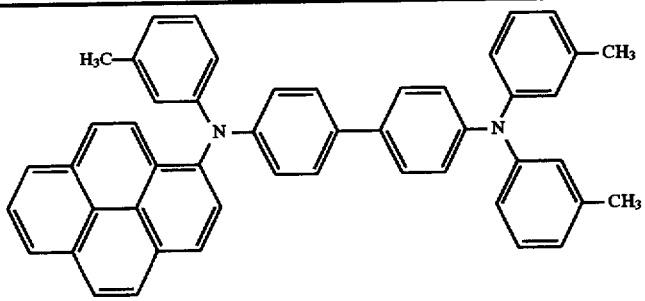

EM-4
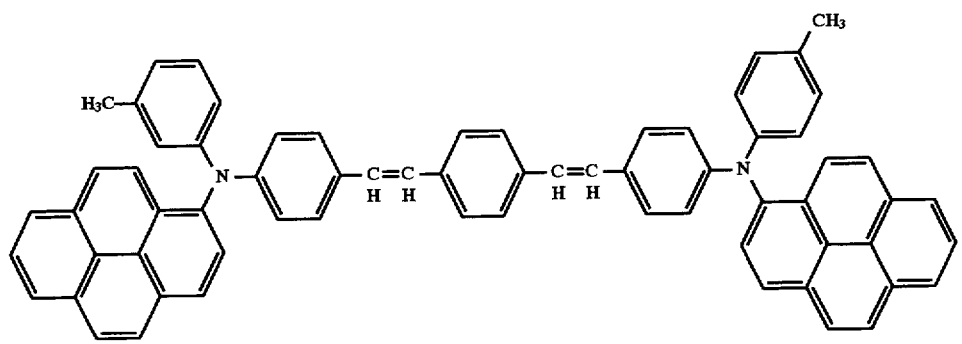

EM-5
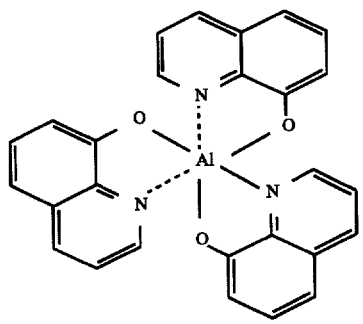

EM-6
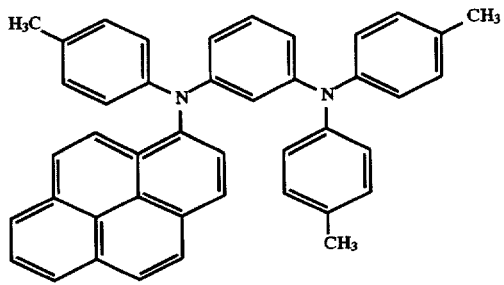

The organic EL display device according to the present invention does not, over a long period of continuous drive, result in decreased light emission output, and the driving voltage does not increase significantly. Consequently, the organic EL device of the present invention finds application in, among others: back light of flat panel displays and liquid crystal displays; office automation equipment such as the light source of scanners and the light source of electricity elimination in electricity eliminators of copy machines; and simple display devices.

Now, the present invention is illustrated in more details by way of examples.

EXAMPLE I

An ITO (indium-tin-oxide, film thickness; not more than 2,000 Å) substrate was cleaned ultrasonically in a neutral detergent, oxygen-containing detergent, and isopropyl alcohol successively. Then the substrate was boiled in isopropyl alcohol and carefully removed from the solvent. Thereafter, surface treatment was applied using a plasma reactor (PR-501A) manufactured by Yamato Kagaku in the following condition.

Degree of vacuum 0.02 torr
High-frequency output 50 W
Oscillating frequency 13.56 MHz
Reaction time 15 minutes The ionization potential of the ITO substrate with the surface treated as mentioned above was determined by a surface analyzer manufactured by Riken Keiki Co., Ltd.: Ip=5.2 eV was shown. Then, this substrate was set to a vacuum evaporator, which was evacuated to a degree of vacuum of 0.6×10⁻⁶ torr. The compound (HTM-1) mentioned previously in thickness of 400 Å as a hole injection transport layer, the compound (EM-1) mentioned previously in thickness of 150 Å as an emitting layer, the compound (ETM-5) mentioned previously in thickness of 150 Å as a second electron injection and transport layer, and the compound (ETM-11) mentioned previously in thickness of 300 Å as a first electron injection and transport layer were subjected to vapor deposition. In addition, a mask was set on the substrate and a cathode alloy in thickness of 2,000 Å in which Mg:Ag=10:1 (ratio of vapor deposition rate) was formed; thereafter an EL device was prepared having 2 mm×2 mm×2 mm size. The temperature of the substrate in the vapor deposition was room temperature.

Figure 2:
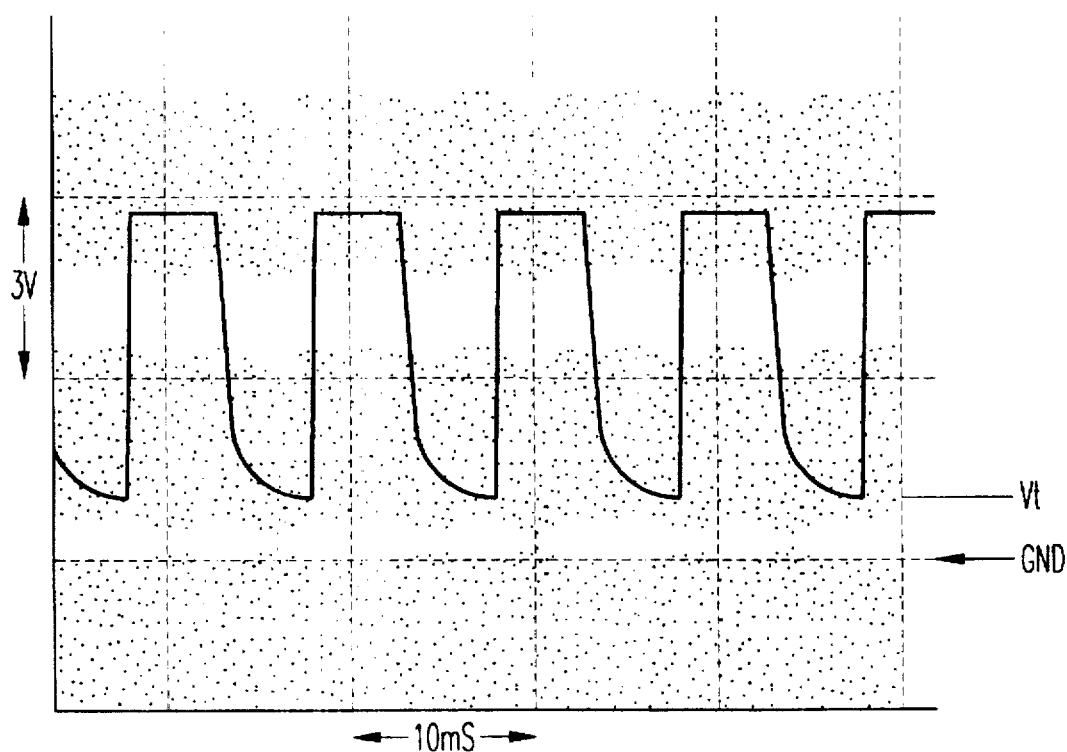
FIG. 2 is a driving wave-form diagram of an organic EL device according to the present invention.
Figure 3:
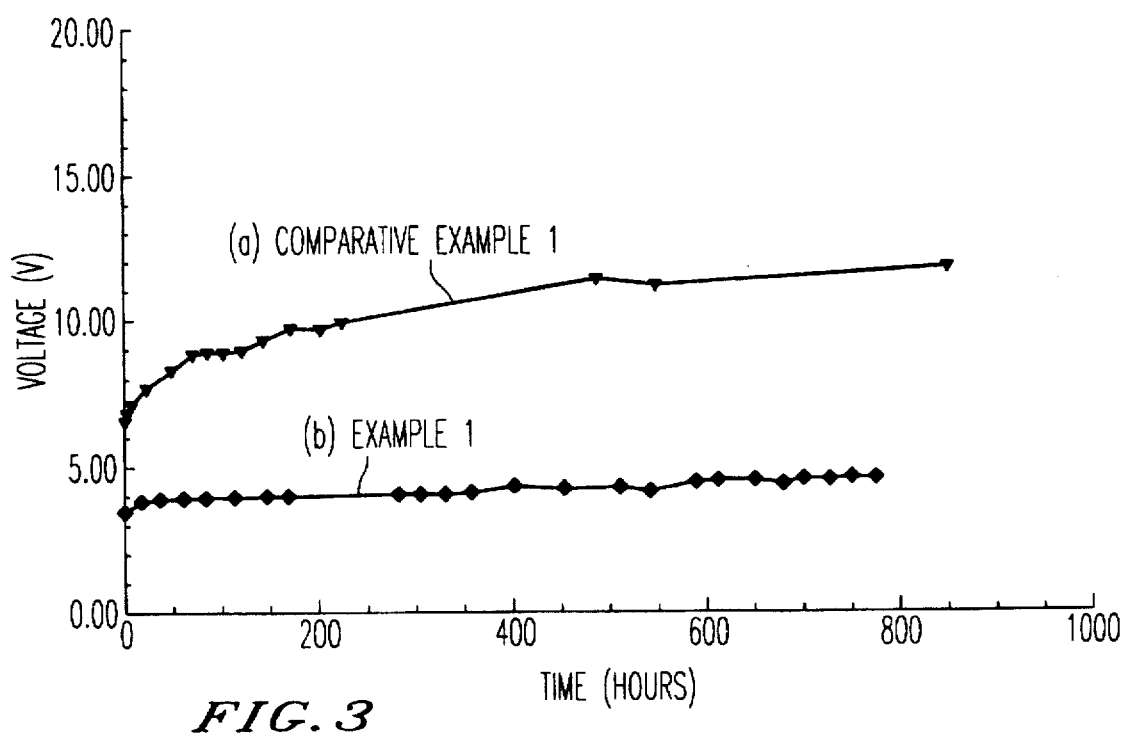
FIG. 3 is a chart showing the change of applied voltage with the elapse of time in continues drive of an organic EL device according to the present invention.

The EL device thus prepared was subjected to a continuous durability test by applying a rectangular wave (see FIG. 2) of: Repeat frequency f=100 Hz; and maximum current density was 30 mA/cm². The effective voltage immediately after applying voltage was 3.4 V; thus, the device functioned at a very low driving voltage. The initial luminescence at that time was 47 cd/m². As shown in FIG. 3 (curve (b)), the voltage elevation with the elapse of time was also small in the device, the value was 4.6 V after 775 hours duration.

COMPARATIVE EXAMPLE 1

An EL device was prepared in the same way as Example 1 except the treatment of ITO substrate by the plasma reactor was omitted. The prepared EL device was subjected to the continuous driving test in the same driving method as Example 1. The initial effective voltage was 5.7 V, which means a higher driving voltage was required the Example 1. The initial luminescence was 51.0 cd/m². The voltage elevation with the elapse of time was significant as shown in FIG. 3 (curve (a)); after elapsing 850 hours, the required driving voltage was 11.7 V. The ITO substrate used in the device had the ionization potential Ip=4.66 eV, which did not satisfy the condition of Formula 1.

EXAMPLE 2

An EL device was prepared in the same way as Example 1 except the plasma reaction time was 5 minutes.

The EL device thus prepared was subjected to a continuous durability test by applying a rectangular wave of: Repeat frequency f=100 Hz; and maximum current density of 30 mA/cm². The effective voltage immediately after applying voltage was 3.30 V; thus, the device functioned at a very low driving voltage. The initial luminescence of that time was 40.3 cd/m². The voltage elevation with the passage of time was also small in the device; the value was 4.22 V after 456 hours of operation.

The ionization potential of the ITO substrate of which surface was treated as in this way was determined by the surface analyzer of Riken Keiki: Ip=5.25 eV was shown, satisfying the condition of Formula 1.

EXAMPLE 3

An ITO (indium-tin-oxide, film thickness: not more than 2,000 Å) substrate was cleaned ultrasonically in a neutral detergent, oxygen-containing detergent, and isopropyl alcohol successively. Then the substrate was boiled in isopropyl alcohol and carefully removed from the solvent. Thereafter, surface treatment was applied using a plasma reactor (PR-501A) manufactured by Yamato Kagaku in the following condition.

Degree of vacuum 0.02 torr

High-frequency output 50 W

Oscillating frequency 13.56 MHz

Reaction time 0, 1, and 5 minutes

Then, these substrates were set to a vacuum evaporator, which was evacuated to a degree of vacuum of 0.6×10⁻⁶ torr. The compound (HTM-1) mentioned previously in thickness of 400 Å as a hole injection transport layer, the compound (EM-1) mentioned previously in thickness of 150 Å as an emitting layer, the compound (ETM-12) mentioned previously in thickness of 150 Å as a second electron injection and transport layer, and the compound (ETM-11) mentioned previously in thickness of 300 Å as a first electron injection and transport layer were subjected to vapor deposition. In addition, a mask was set on the substrates and a cathode alloy in thickness of 2,000 Å in which Mg:Ag=10:1 (ratio of vapor deposition rate) was formed; thereafter EL devices were prepared having 2 mm×2 mm×2 mm size. The temperature of the substrates during vapor deposition was room temperature.

The EL devices thus prepared were subjected to a continuous durability test under a constant direct current condition by applying a voltage with the maximum current density of 10 mA/cm². Table 4 shows the ionization potential values of the ITO layers and durability of the devices. It is clear that the initial driving voltage was low and the voltage elevation with the passage of time was inhibited in the case the ionization potential of the ITO film is not less than 5.0 eV.

TABLE 4

| Plasma Reaction Period (min) | Ip of ITO Film (eV) | Initial Driving Voltage (V) | Initial Luminescence (cd/m²) | Driving Voltage after 251 hrs (V) |
|---|---|---|---|---|
| 0 | 4.66 | 7.40 | 191 | 13.6 |
| 1 | 5.06 | 6.16 | 194 | 9.72 |
| 5 | 5.02 | 6.50 | 193 | 9.47 |

EXAMPLE 4

An ITO (indium-tin-oxide, film thickness: not more than 2,000 Å) substrate was cleaned ultrasonically in a neutral detergent, oxygen-containing detergent, and isopropyl alcohol successively. Then the substrate was boiled in isopropyl alcohol and carefully removed from the solvent.

Thereafter, surface treatment was applied using a plasma reactor (PR-501A) manufactured by Yamato Kagaku in the following condition.

Degree of vacuum 0.02 torr

High-frequency output 50 W

Oscillating frequency 13.56 MHz

Reaction time 0, 1, and 5 minutes

Figure 4:
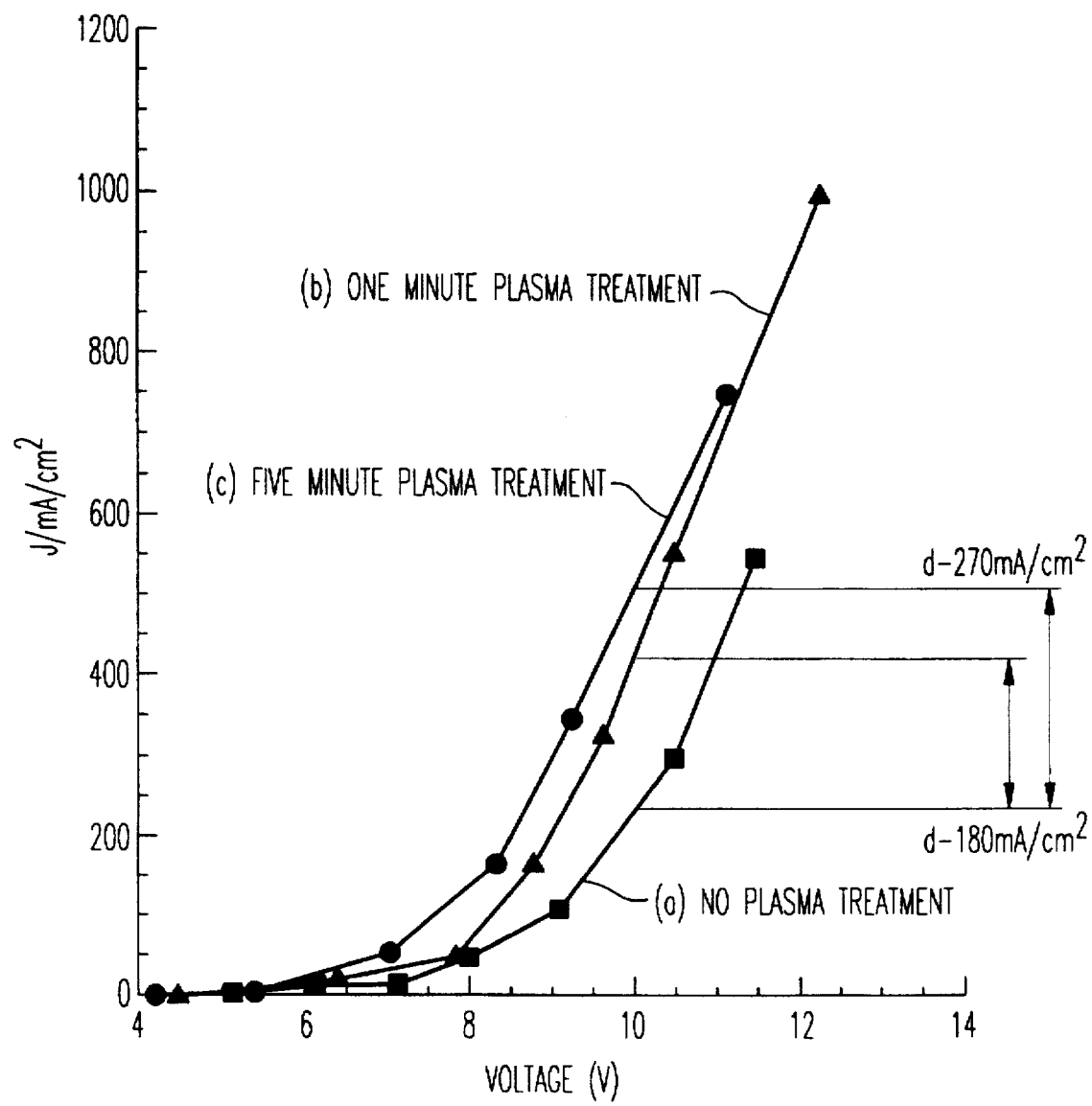
FIG. 4 is a current-voltage characteristic chart.

Then, these substrates were set to a vacuum evaporator, which was evacuated to a degree of vacuum of 0.6×10⁻⁶ torr. The compound (HTM-1) mentioned previously in thickness of 400 Å as a hole injection transport layer, the compound (EM-1) mentioned previously in thickness of 150 Å as an emitting layer, the compound (ETM-13) mentioned previously in thickness of 150 Å as a second electron injection and transport layer, and the compound (ETM-11) mentioned previously in thickness of 300 Å as a first electron injection and transport layer were subjected to vapor deposition. In addition, a mask was set on the substrates and a cathode alloy in thickness of 2,000 Å in which Mg:Ag=10:1 (ratio of vapor deposition rate) was formed; thereafter EL devices were prepared having 2 mm×2 mm×2 mm Size. The temperature of substrates at the vapor deposition was room temperature. The three EL devices thus prepared were subjected to current-voltage characteristic determination; FIG. 4 shows the results. It is seen that the device resistance was lowered to nearly ½ and the hole injection barrier was lowered.

EXAMPLE 5

In the same manner as Example 4, an ITO (indium-tinoxide, film thickness; not more than 20,000 Å) substrate was cleaned ultrasonically in a neutral detergent, oxygen-containing detergent, and isopropyl alcohol successively. Then the substrate was boiled in isopropyl alcohol and carefully removed from the solvent. Thereafter, surface treatment was applied using a plasma reactor (PR-501A) manufactured by Yamato Kagaku in the following condition.

Degree of vacuum 0.02 torr

High-frequency output 50 W oscillating frequency 13.56 MHz

Reaction time 3 minutes

The ionization potential of the ITO substrate of which surface was treated as mentioned above was determined; thereby, Ip=5.20 eV was shown. This substrate was set to a vacuum evaporator, which was evacuated to a degree of vacuum of $0.6 \times 10^{-6}$ torr. The compound (HTM-1) mentioned previously in thickness of 500 Å as a hole injection transport layer and the compound (EM-5) mentioned previously in thickness of 500 Å were subjected to vapor deposition. In addition, a mask was set on the substrates and a cathode alloy in thickness of 2,000 Å in which Mg:Ag=10:1 (ratio of vapor deposition rate) was formed; thereafter EL devices were prepared having 2 mm×2 mm×2 mm size. The temperature of substrates at the vapor deposition was room temperature.

The EL device thus prepared was subjected to a continuous durability test under a constant direct current condition by applying a voltage with the maximum current density of 10 mA/cm$^2$; the initial driving voltage was lower and the voltage elevation with the passage of time was more inhibited compared with the case where untreated ITO film was used.

EXAMPLE 6

In the same manner as Example 4, an ITO (indium-tinoxide, film thickness: not more than 2,000 Å) substrate was cleaned ultrasonically in a neutral detergent, oxygen-containing detergent, and isopropyl alcohol successively. Then the substrate was boiled in isopropyl alcohol and carefully removed from the solvent. Thereafter, surface treatment was applied using a plasma reactor (PR-501 Å) manufactured by Yamato Kagaku in the following condition.

Degree of vacuum 0.02 torr

High-frequency output 50 W oscillating frequency 13.56 MHz

Reaction time 3 minutes

The ionization potential of the ITO substrate of which surface was treated as mentioned above was determined. Thereby, Ip=5.20 eV was shown. This substrates was set to a vacuum evaporator, which was evacuated to a degree of vacuum of $0.6 \times 10^{-6}$ torr. The compound (EM-1) mentioned previously in thickness of 500 Å as an emitting layer and an electron injection and transporting layer (ETM-2) in thickness of 500 Å were subjected to vapor deposition. In addition, a mask was set on the substrates and a cathode alloy in thickness of 2,000 Å in which Mg:Ag=10:1 (ratio of vapor deposition rate) was formed; thereafter EL devices were prepared having 2 mm×2 mm×2 mm size. The temperature of substrates at the vapor deposition was room temperature.

The EL device thus prepared was subjected to a continuous durability test under a constant direct current condition by applying a voltage with the maximum current density of 10 mA/cm$^2$; the initial driving voltage was lower and the voltage elevation with the passage of time was inhibited compared with the case where untreated ITO film was used.

EXAMPLE 7

In the same manner as Example 4, an ITO (indium-tinoxide, film thickness: not more than 2,000 Å) substrate was cleaned ultrasonically in a neutral detergent, oxygen-containing detergent, and isopropyl alcohol successively. Then the substrate was boiled in isopropyl alcohol and carefully removed from the solvent. Thereafter, surface treatment was applied using a plasma reactor (PR-501A) manufactured by Yamalto Kagaku in the following condition.

Degree of vacuum 0.02 torr

High-frequency output 50 W

Oscillating frequency 13.56 MHz

Reaction time 3 minutes

The ionization potential of the ITO substrate of which surface was treated as mentioned above was determined. Thereby, Ip=5.20 eV was shown. This substrates was set to a vacuum evaporator, which was evacuated to a degree of vacuum of $0.6 \times 10^{-6}$ torr. The compound (EM-2) mentioned previously in thickness of 1000 Å as an emitting layer was subjected to vapor deposition. In addition, a mask was set on the substrates and a cathode alloy in thickness of 2,000 Å in which Mg:Ag=10:1 (ratio of vapor deposition rate) was formed; thereafter EL devices were prepared having 2 mm×2 mm×2 mm size. The temperature of substrates at the vapor deposition was room temperature.

The EL device thus prepared was subjected to a continuous durability test under a constant direct current condition by applying voltage with a maximum current density of 10 mA/cm$^2$; the initial driving voltage was lower and the voltage elevation with the passage of time was more inhibited compared with the case where untreated ITO film was used.

What is claimed as new and is desired to be secured by letters patent of the United States is:

1. An organic thin film electroluminescence device, consisting of:

a) a cathode, b) an anode facing said cathode, and c) an organic light emitting layer between said anode and cathode, wherein the surface of said anode facing said cathode satisfies the inequality Ip>5.0 eV.

2. An organic thin film electroluminescence device according to claim 1, wherein the anode has a transmittance not less than 60% in the visible region of 400 nm to 800 nm.

3. An organic thin film electroluminescence device according to claim 1, wherein the anode is comprised of a surface plasma-treated indium-tin-oxide (ITO) semiconductor thin film.

4. An organic thin film electroluminescence device according to claim 2, wherein the anode is comprised of a surface plasma-treated indium-tin-oxide (ITO) semiconductor thin film.

5. The device of claim 1, wherein said light emitting layer is in direct contact with said anode.

6. An organic thin film electroluminescence device, consisting of:
   a) a cathode,
   b) an anode facing said cathode,
   c) an organic light emitting layer between said anode and cathode, and
   d) one or more electron injection and transporting layers,
   wherein the surface of said anode facing said cathode satisfies the inequality $I_p > 5.0$ eV.

7. The device of claim 6, consisting of said cathode, said anode, said light emitting layer, and plural electron injection and transporting layers.

8. The device of claim 6, wherein the anode has a transmittance not less than 60% in the visible region of 400 nm to 800 nm.

9. The device according to claim 6, wherein the anode is comprised of a plasma-treated indium-tin-oxide (ITO) semiconductor thin film.

10. The device according to claim 8, wherein the anode is comprised of a surface plasma-treated indium-tin-oxide (ITO) semiconductor thin film.

11. The device of claim 6, wherein said light emitting layer is in direct contact with said anode.

* * * * *